(12) United States Patent
Choi et al.

(10) Patent No.: US 12,353,077 B2
(45) Date of Patent: Jul. 8, 2025

(54) LIGHT PATH CONTROL MEMBER AND DISPLAY APPARATUS COMPRISING SAME

(71) Applicant: LG INNOTEK CO., LTD., Seoul (KR)

(72) Inventors: Won Seok Choi, Seoul (KR); Jin Gyeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/729,771

(22) PCT Filed: Dec. 14, 2022

(86) PCT No.: PCT/KR2022/020332
§ 371 (c)(1),
(2) Date: Jul. 17, 2024

(87) PCT Pub. No.: WO2023/136482
PCT Pub. Date: Jul. 20, 2023

(65) Prior Publication Data
US 2025/0102842 A1    Mar. 27, 2025

(30) Foreign Application Priority Data

Jan. 17, 2022 (KR) .................. 10-2022-0006846

(51) Int. Cl.
*G02F 1/13* (2006.01)
*G02F 1/1333* (2006.01)
(Continued)

(52) U.S. Cl.
CPC ...... *G02F 1/1323* (2013.01); *G02F 1/133377* (2013.01); *G02F 1/133606* (2013.01);
(Continued)

(58) Field of Classification Search
CPC ................. G02F 1/1323; G02F 1/1675; G02F 1/133377; G02F 1/133606; G02F 1/167;
(Continued)

(56) References Cited

U.S. PATENT DOCUMENTS 11,256,125 B2 * 2/2022 Kashiwagi ........ G02F 1/133504
11,635,562 B2 * 4/2023 Kashiwagi ........... G02B 6/0055
349/62

(Continued)

FOREIGN PATENT DOCUMENTS

JP            2015-72341 A        4/2015
KR   10-2015-0125051 A           11/2015
(Continued)

OTHER PUBLICATIONS

International Search Report dated Mar. 15, 2023 in International Application No. PCT/KR2022/020332.

*Primary Examiner* — Anne M Hines
(74) *Attorney, Agent, or Firm* — Saliwanchik, Lloyd & Eisenschenk

(57) ABSTRACT

A light path control member according to an embodiment includes a first substrate; a first electrode disposed on the first substrate; a second substrate disposed on the first substrate; a second electrode disposed under the second substrate; a light conversion part disposed between the first electrode and the second electrode; and an adhesive layer disposed between the second electrode and the light conversion part, wherein the light conversion part includes a plurality of receiving parts, wherein the adhesive layer includes an overlapping region that overlaps the receiving part and a non-overlapping region that does not overlap the receiving part, and wherein the overlapping region includes regions with different thicknesses.

20 Claims, 12 Drawing Sheets

(51) Int. Cl.
*G02F 1/13357* (2006.01)
*G02F 1/167* (2019.01)
*G02F 1/1675* (2019.01)
*H10K 59/50* (2023.01)

(52) U.S. Cl.
CPC ............ *G02F 1/167* (2013.01); *G02F 1/1675* (2019.01); *H10K 59/50* (2023.02); *G02F 2201/44* (2013.01); *G02F 2202/28* (2013.01)

(58) Field of Classification Search
CPC .. G02F 2201/44; G02F 2208/28; H10K 59/50
See application file for complete search history.

(56) References Cited

U.S. PATENT DOCUMENTS 11,966,106 B2 * 4/2024 Lee .................. G02F 1/1323
2023/0161187 A1 5/2023 Lee et al.

FOREIGN PATENT DOCUMENTS

| KR | 10-2018-0004879 A | 1/2018 |
| KR | 10-2195661 B1 | 12/2020 |
| KR | 10-2021-0136603 A | 11/2021 |
| WO | 2021/221358 A1 | 11/2021 |

* cited by examiner $R_1$: $R_{electrode}$
$R_2$: $R_{adhesive\ layer}$
$R_3$: $R_{light\ conversion\ material}$ $R_1$: $R_{electrode}$
$R_2$: $R_{adhesive\ layer}$
$R_3$: $R_{light\ conversion\ material}$

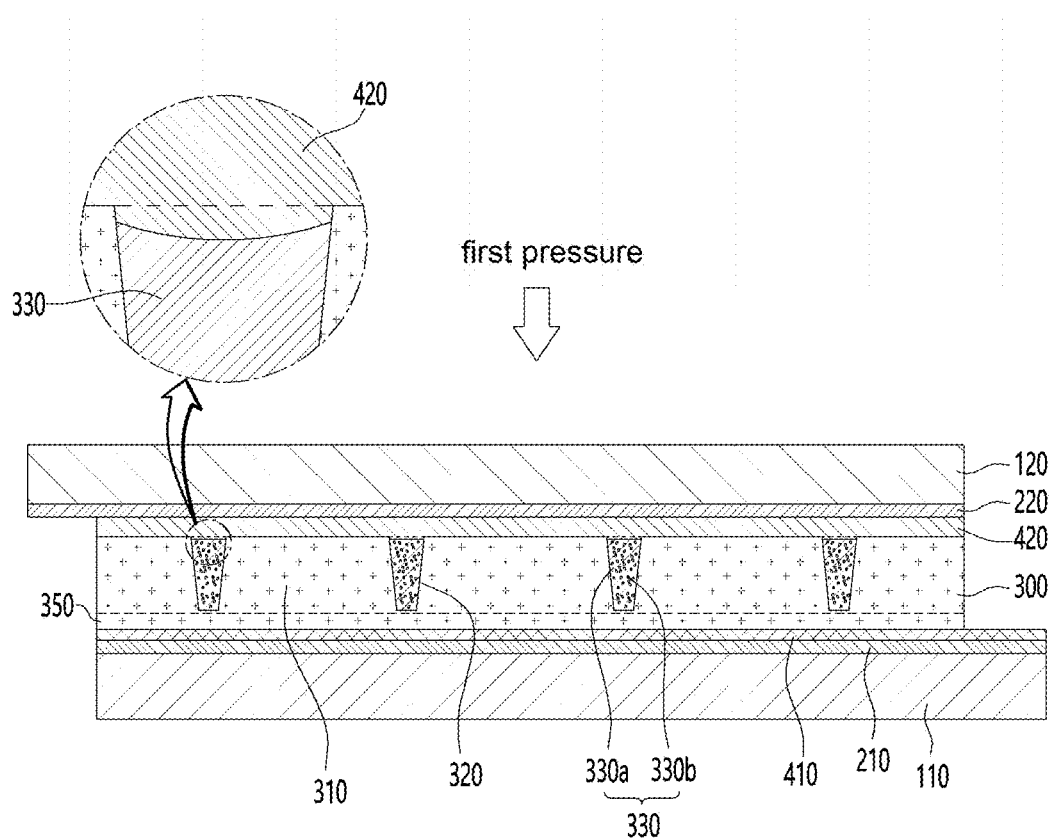

FIG. 12
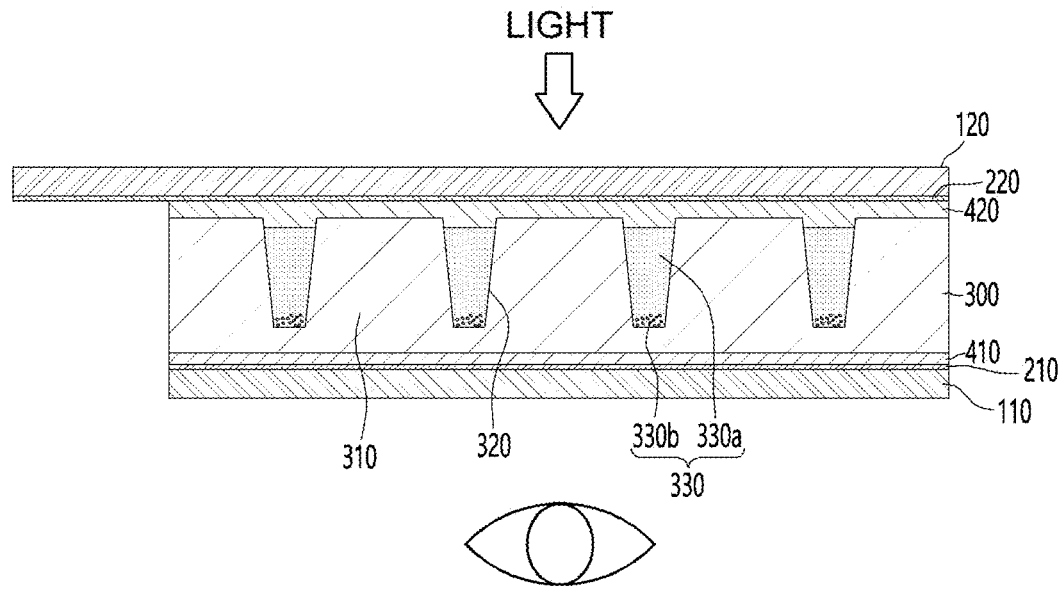
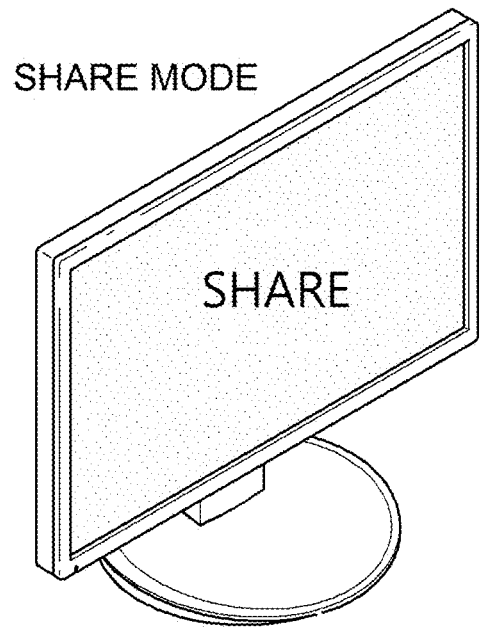

FIG. 13
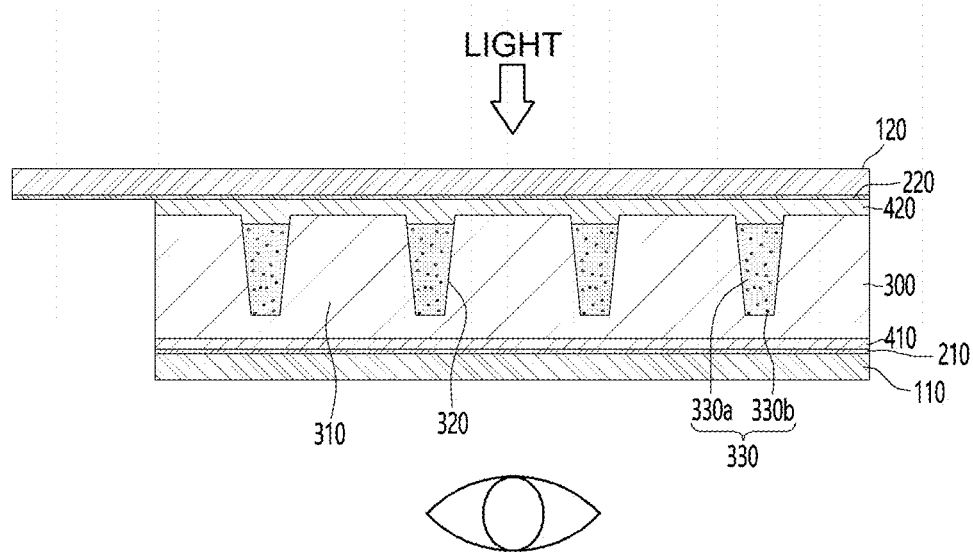
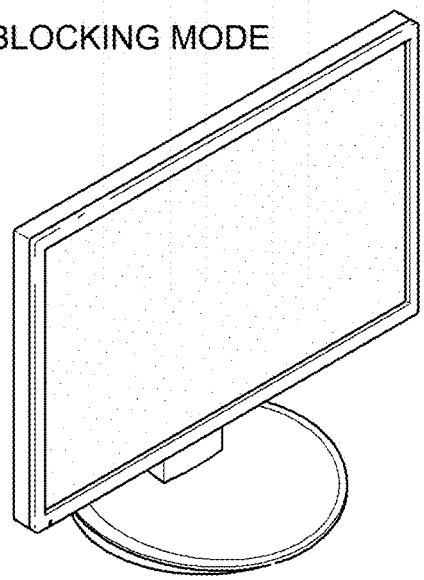
LIGHT BLOCKING MODE

LIGHT PATH CONTROL MEMBER AND DISPLAY APPARATUS COMPRISING SAME

CROSS-REFERENCE TO RELATED APPLICATIONS

This application is the U.S. national stage application of International Patent Application No. PCT/KR2022/020332, filed Dec. 14, 2022, which claims the benefit under 35 U.S.C. § 119 of Korean Application No. 10-2022-0006846, filed Jan. 17, 2022, the disclosures of each of which are incorporated herein by reference in their entirety.

TECHNICAL FIELD

An embodiment relates to a light path control member and a display apparatus including the same.

BACKGROUND ART

A light blocking film is a film that blocks light from being transmitted from a light source. The light blocking film is attached to a front of a display panel, which is a display device used for a mobile phone, laptop, tablet PC, vehicle navigation, or vehicle touch screen. The light blocking film adjusts a viewing angle of light according to an angle of incidence of light when the display outputs a screen. As a result, the user can view clear image quality at the desired viewing angle.

In addition, light blocking film is used for windows in vehicles or buildings. In detail, the light blocking film can inhibit glare by partially shielding external light. Alternatively, the light blocking film can make an inside invisible from an outside.

That is, the light blocking film controls a movement path of light. As a result, the light blocking film can block light at an angle within a set range and transmit light at an angle within a set range. Accordingly, a transmission angle of light is controlled by the light blocking film.

The light blocking film can be divided into a light blocking film that can always control the viewing angle regardless of the surrounding environment, and a switchable light blocking film that allows the user to turn the viewing angle control on and off depending on the surrounding environment.

The switchable light blocking film includes a light conversion part including a receiving part. The receiving part is filled with a light conversion material including particles and a dispersion liquid for dispersing the particles. The particles can move by application of voltage. The receiving part may be converted into a light transmitting part and a light blocking part by dispersion and aggregation of the particles.

The particles can move by the applied voltage. At this time, the resistance may be increased by an adhesive layer disposed between the light conversion part and the electrode. As a result, a driving speed of the switchable light blocking film may be reduced.

Accordingly, a light path control member with a new structure that can solve the above problems is required.

DISCLOSURE

Technical Problem

An embodiment provides a light path control member with improved driving speed and driving characteristics.

Technical Solution

A light path control member according to an embodiment includes a first substrate; a first electrode disposed on the first substrate; a second substrate disposed on the first substrate; a second electrode disposed under the second substrate; a light conversion part disposed between the first electrode and the second electrode; and an adhesive layer disposed between the second electrode and the light conversion part, wherein the light conversion part includes a plurality of receiving parts, wherein the adhesive layer includes an overlapping region that overlaps the receiving part and a non-overlapping region that does not overlap the receiving part, and wherein the overlapping region includes regions with different thicknesses.

Advantageous Effects

The light path control member according to the embodiment has improved driving speed.

In detail, the adhesive layer disposed inside the receiving part is formed to have a non-uniform thickness. As a result, the resistance caused by the adhesive layer can be reduced.

Accordingly, it is possible to inhibit the light conversion characteristics of the light conversion material disposed inside the receiving part from being reduced due to the resistance of the adhesive layer.

In addition, the light path control member according to the embodiment may have improved driving characteristics.

In detail, a thickness difference of the adhesive layer disposed inside a plurality of receiving parts can be formed within a set range. As a result, a difference in light conversion speed between the plurality of receiving parts can be reduced. Accordingly, the driving characteristics of the light path control member can be improved.

DESCRIPTION OF DRAWINGS

FIGS. 7 to 9 are views for explaining a manufacturing process of a light path control member according to an embodiment.

FIGS. 12 to 14 are views for explaining an embodiment of a display device to which an light path control member according to an embodiment is applied.

BEST MODE

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and redisposed.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Hereinafter, a light path control member according to an embodiment will be described with reference to the drawings. The light path control member described hereinafter may be a switchable light blocking film that is driven in a share mode or a light blocking mode according to an application of power.

Figure 1:
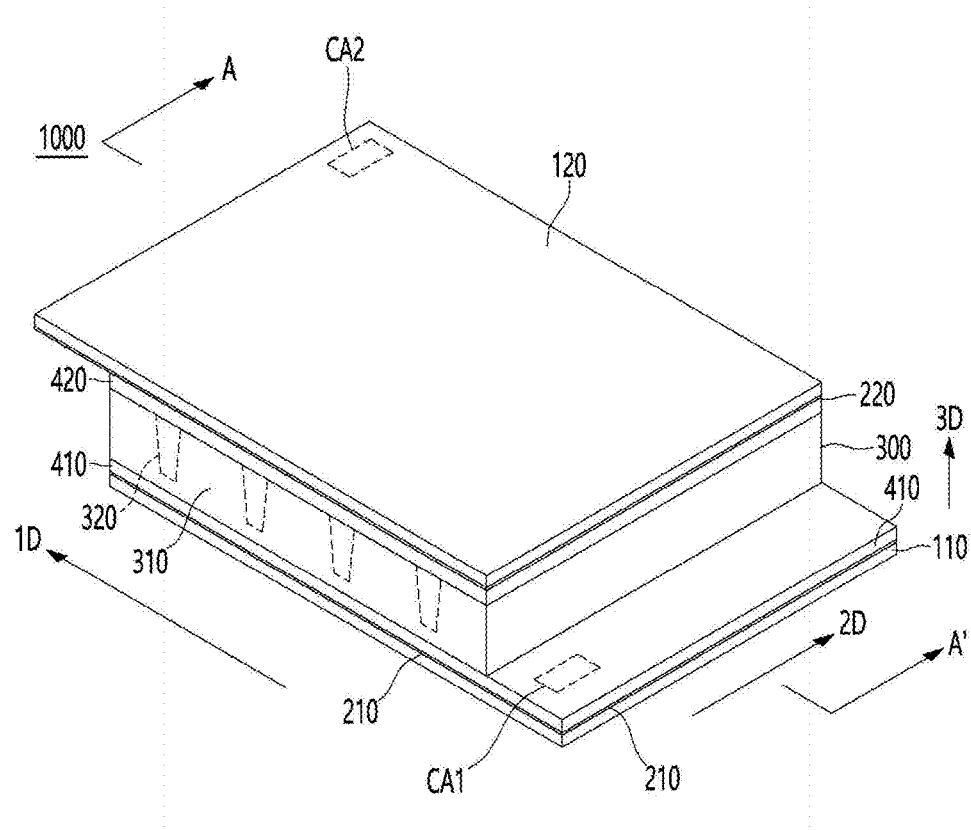
FIG. 1 is a perspective view of a light path control member according to an embodiment.

FIG. 1 is a perspective view of a light path control member according to an embodiment.

The light path control member may extend in a first direction 1D, a second direction 2D, and a third direction 3D.

Specifically, the first direction 1D and the second direction 2D may correspond to a longitudinal direction or a width direction of the light path control member. In addition, the first direction 1D and the second direction 2D may be different directions. Also, the third direction 3D may correspond to a thickness direction of the light path control member.

Hereinafter, for convenience of explanation, the first direction 1D is defined in the longitudinal direction of the light path control member. Furthermore, the second direction 2D is defined in the width direction of the light path control member. Furthermore, the third direction 3D is defined in the thickness direction of the light path control member.

Referring to FIG. 1, the light path control member 1000 according to an embodiment includes a first substrate 110, a second substrate 120, a first electrode 210, a second electrode 220, and a light conversion part 300.

The first substrate 110 and the second substrate 120 may be rigid or flexible.

In addition, the first substrate 110 and the second substrate 120 may be transparent. For example, the first substrate 110 and the second substrate 120 may include a transparent substrate capable of transmitting light.

The first substrate 110 and the second substrate 120 may include glass, plastic, or a flexible polymer film. For example, the flexible polymer film may include any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), Triacetylcellulose (TAC), polyvinyl alcohol (PVA) film, polyimide (PI), or polystyrene (PS).

In addition, the first substrate 110 and the second substrate 120 may be a flexible substrate with flexible characteristics.

Also, the first substrate 110 and the second substrate 120 may be curved or bent. Therefore, the light path control member may also have flexible, curved, or bent characteristics. Accordingly, the light path control member may be formed in various designs.

The first substrate 110 and the second substrate 120 may have a thickness within a predetermined range. For example, thicknesses of the first substrate 110 and the second substrate 120 may be in a range of 30 μm to 100 μm. Specifically, the thicknesses of the first substrate 110 and the second substrate 120 may be in a range of 40 μm to 80 μm. More specifically, the thicknesses of the first substrate 110 and the second substrate 120 may be in a range of 50 μm to 60 μm.

When the thicknesses of the first substrate 110 and the second substrate 120 exceed 100 μm, the overall thickness and weight of the light path control member may be increased.

In addition, when the thicknesses of the first substrate 110 and the second substrate 120 are less than 30 μm, a support force of the first substrate 110 and the second substrate 120 may be reduced.

Thicknesses of the first substrate 110 and the second substrate 120 may be the same or similar within the set range.

The first electrode 210 and the second electrode 220 may include a transparent conductive material. For example, the first electrode 210 and the second electrode 220 may include a conductive material having a light transmittance of about 80% or more. For example, the first electrode 210 and the second electrode 220 may include a metal oxide such as indium tin oxide, indium zinc oxide, copper oxide, tin oxide, zinc oxide, titanium oxide and the like.

Alternatively, the first electrode 210 and the second electrode 220 may include various metals to realize low resistance. For example, the first electrode 210 and the second electrode 220 may include at least one metal among chromium (Cr), nickel (Ni), copper (Cu), aluminum (Al), silver (Ag), molybdenum (Mo). Gold (Au), titanium (Ti), and alloys thereof.

The first electrode 210 and the second electrode 220 may have a thickness within a predetermined range. For example, the thicknesses of the first electrode 210 and the second electrode 220 may be 0.2 μm to 1 μm. Specifically, the thicknesses of the first electrode 210 and the second electrode 220 may be 0.2 μm to 0.5 μm.

When the thicknesses of the first electrode 210 and the second electrode 220 exceed 1 μm, the overall thickness and weight of the light path control member may be increased.

Also, when the thicknesses of the first electrode 210 and the second electrode 220 are less than 0.2 μm, conductivity of the first electrode 210 and the second electrode 220 may be reduced. Accordingly, driving characteristics of the light path control member may be reduced.

Thicknesses of the first electrode 210 and the second electrode 220 may be the same or similar within the set range.

Connection electrodes may be disposed on each of the first substrate 110 and the second substrate 120. In detail, a first connection electrode CA1 may be disposed on the first substrate 110. The first connection electrode CA1 may be formed by exposing the first electrode 210. Also, a second connection electrode CA2 may be disposed on the second substrate 120. The second connection electrode CA2 may be formed by exposing the second electrode 220.

The light path control member may be electrically connected to an external (flexible) printed circuit board by the first connection electrode CA1 and the second connection region CA2.

For example, a pad part may be disposed on the first connection electrode CA1 and the second connection electrode CA2. A conductive adhesive including an anisotropic conductive film (ACF) or anisotropic conductive paste (ACP) may be disposed between the pad part and the (flexible) printed circuit board. Accordingly, the light path control member may be electrically connected to an external (flexible) printed circuit board.

Alternatively, a conductive adhesive including an anisotropic conductive film (ACF) or anisotropic conductive paste (ACP) is disposed between the first connection electrode CA1 and the second connection electrode CA2 and the (flexible) printed circuit board. That is, the pad part may be omitted. Accordingly, the light path control member may be directly connected to an external (flexible) printed circuit board.

The light conversion part 300 may be disposed between the first substrate 110 and the second substrate 120. Specifically, the light conversion part 300 may be disposed between the first electrode 210 and the second electrode 220.

A buffer layer 410 may be disposed between the light conversion part 300 and the first electrode 210. Adhesive force between the first electrode 220 and the light conversion part 300 may be improved by the buffer layer 410. That is, the buffer layer 410 may be a primer layer disposed between the light conversion part 300 and the first electrode 210.

An adhesive layer 420 may be disposed between the light conversion part 300 and the second electrode 220. The light conversion part and the second electrode 220 may be adhered by the adhesive layer 420.

The buffer layer 410 and the adhesive layer 420 may include a transparent material through which light may be transmitted. For example, the buffer layer 410 may include a transparent resin. Also, the adhesive layer 420 may include an optical transparent adhesive (OCA).

The adhesive layer 420 is disposed on the light conversion part 300. A pressure may be applied when the light conversion part 300 and the second electrode 220 are adhered. The adhesive layer 420 may be introduced into the receiving part 320 of the light conversion part 300 by the pressure.

The adhesive layer 420 is a non-conductive material. Also, the adhesive layer 420 may include a material having a high resistance. Accordingly, when the adhesive layer 420 is disposed inside the receiving part, a voltage transmitted to the light conversion material may not easily move. Accordingly, driving characteristics of the light path control member may be reduced.

Hereinafter, an light path control member capable of solving the above problems will be described.

Figure 2:
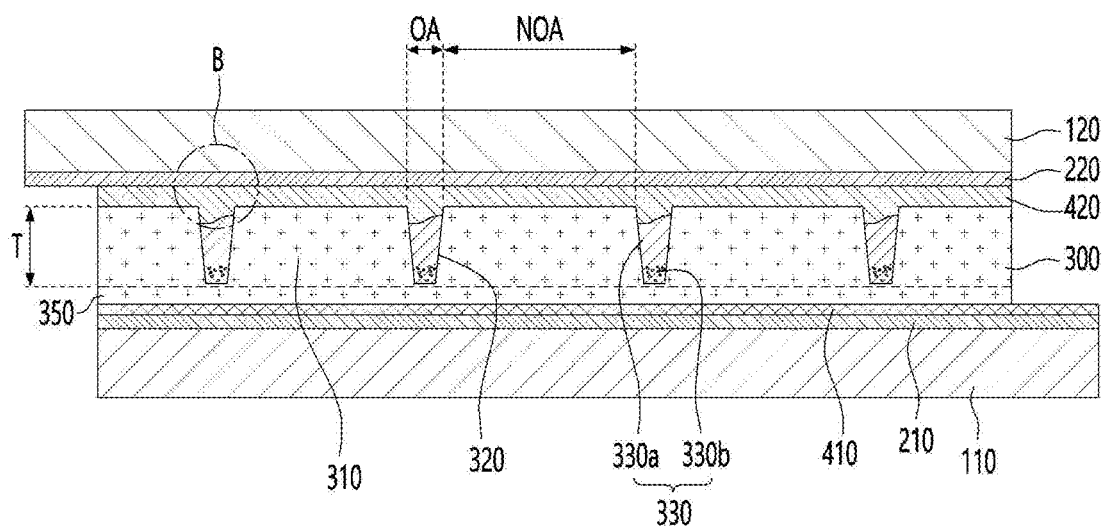
FIGS. 2 and 3 are views illustrating a cross-sectional view taken along A-A' region of FIG. 1.
Figure 3:
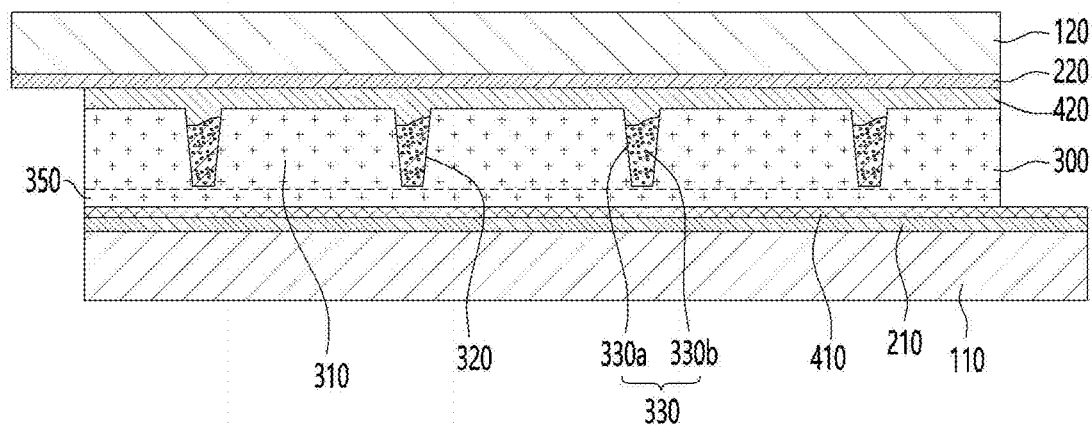
Figure 4:
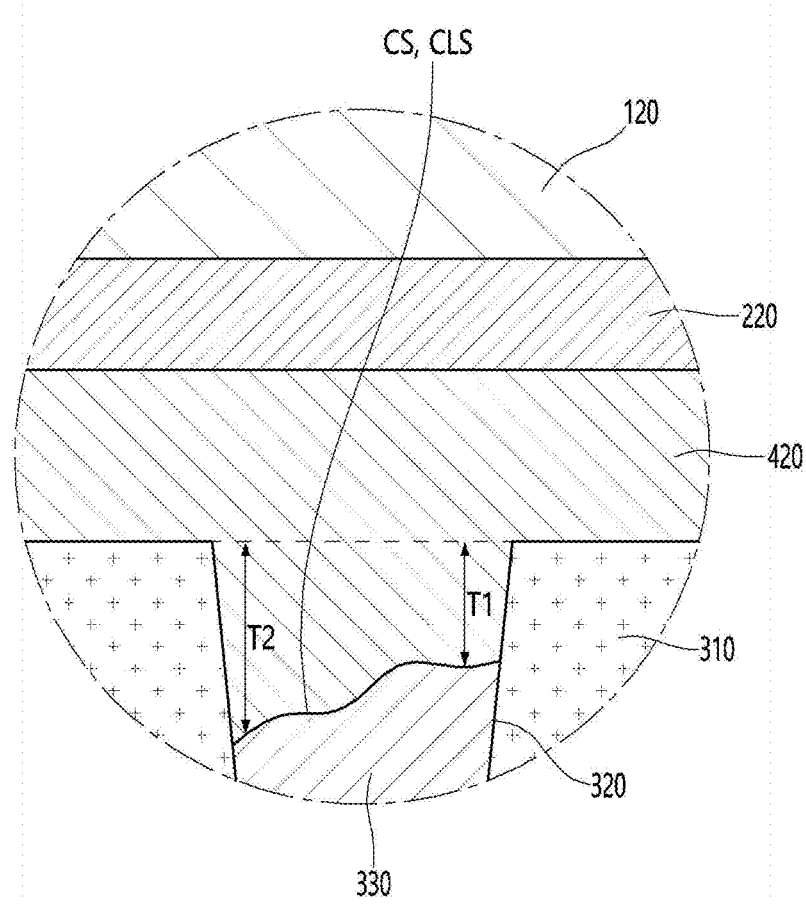
FIGS. 4 and 5 are views illustrating an enlarged view of the region of FIG. 2.
Figure 5:
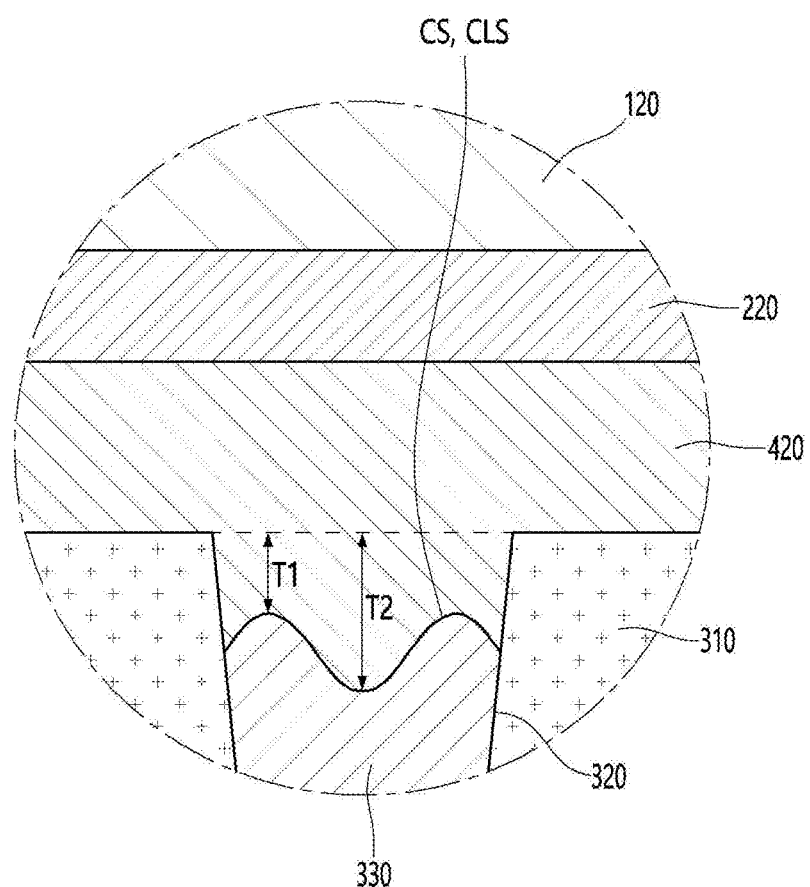

FIGS. 2 and 3 are views illustrating a cross-sectional view taken along A-A' region of FIG. 1, and FIGS. 4 and 5 are views illustrating an enlarged view of the region of FIG. 2.

Referring to FIGS. 2 to 5, the light conversion part 300 may include a plurality of partition wall parts 310, a plurality of receiving parts 320, and a base part 350.

The partition wall part 310 and the receiving part 320 may be alternately disposed. That is, one receiving part 320 is disposed between two adjacent partition wall parts 310. Also, one partition wall part 310 may be disposed between two adjacent receiving parts 320.

The base part 350 may be disposed under the receiving part 320. Specifically, the base part 350 may be disposed between the receiving part 320 and the buffer layer 410. More specifically, the base part 350 may be disposed between a lower surface of the receiving part 320 and an upper surface of the buffer layer 410. Accordingly, the light conversion part 300 and the first electrode 210 may be adhered by the base part 350 and the buffer layer 410.

Also, an adhesive layer 420 may be disposed between the partition wall part 310 and the second electrode 220. The light conversion part 300 and the second electrode 220 may be adhered by the adhesive layer 420.

The base part 350 is a region formed when the resin material used to form the partition wall part 310 and the receiving part 320 is released from a mold member. Accordingly, the base part 350 may include the same material as the partition wall part 310. That is, the base part 350 and the partition wall part 310 may be integrally formed.

The partition wall part 310 may transmit light. Also, the light transmittance of the receiving part 320 may be changed by the application of a voltage.

Specifically, a light conversion material 330 may be disposed inside the receiving part 320. The light transmittance of the receiving part 320 may be changed by the light conversion material 330. The light conversion material 330 may include light conversion particles 330b and a dispersion liquid 330a. The light conversion particles 330b may move by the application of a voltage. Also, the dispersion liquid 330a may disperse the light conversion particles 330b. Also, the light conversion material 300 may further include a dispersant inhibiting aggregation of the light conversion particles 330b.

When a voltage is applied, the light conversion particles 330b may be moved. For example, referring to FIG. 2, surfaces of the light conversion particles 330b are charged with negative charges. When the first electrode 210 and the second electrode 220 apply a positive voltage, the light conversion particles 330b are moved toward the first electrode 210 or the second electrode 220. Accordingly, the receiving part 320 may become a light transmitting part.

Also, referring to FIG. 3, a negative voltage may be applied to the first electrode 210 and the second electrode 220. Accordingly, the light conversion particles 330b are dispersed again into the dispersion liquid 330a. Accordingly, the receiving part 320 may be a light blocking part.

Meanwhile, the adhesive layer 420 may be disposed inside the receiving part 320.

Referring to FIGS. 2 to 5, the adhesive layer 420 may be divided into two regions. Specifically, the adhesive layer 420 disposed on the light conversion part 300 may include an overlapping region OA overlapping the receiving part 320 and a non-overlapping region NOA that does not overlap the receiving part 320.

The adhesive layer 420 may also be disposed inside the receiving part in the overlapping region OA. For example, the adhesive layer 420 may be disposed to have a thickness ranging from 2% to 25% of the thickness T of the receiving part in the overlapping region OA.

It may be difficult to implement the adhesive layer 420 to be formed to be less than 2% of the thickness of the receiving part in the overlapping region OA. Also, when the adhesive layer 420 is formed to be greater than 25% of the thickness of the receiving part in the overlapping region OA, the thickness of the adhesive layer disposed inside the receiving part increases. As a result, the light conversion characteristics of the light path control member may be reduced.

Accordingly, the thickness of the adhesive layer 420 in the overlapping region OA may be greater than that of the adhesive layer 420 in the non-overlapping region NOA.

The adhesive layer 420 disposed in the overlapping region OA may be in contact with the light conversion material 330 disposed inside the receiving part 320. That is, the adhesive layer 420 may form a contact surface CS with the light conversion material 330.

The overlapping region OA of the adhesive layer 420 may include regions having different thicknesses. That is, the overlapping region OA of the adhesive layer 420 may not have a uniform thickness.

The adhesive layer 420 may have an inclined surface on the contact surface CS. Specifically, the adhesive layer 420 may have at least one inclined surface CLS on the contact surface CS. The adhesive layer 420 disposed in the overlapping region OA by the inclined surface CLS may have a plurality of thicknesses. That is, the adhesive layer 420 may have different thicknesses at each position in the overlapping region OA by the inclined surface CLS.

The thickness of the adhesive layer 420 may be defined as a vertical distance from one surface of the adhesive layer 420 in contact with the second electrode 220 to the other surface of the adhesive layer 420 in contact with the light conversion material 330.

That is, the thickness of the overlapping region OA may be defined as a thickness from a contact surface between the adhesive layer 410 and the second electrode 220 to a contact surface between the adhesive layer 410 and the light conversion material 330.

That is, the adhesive layer 420 may have a plurality of thicknesses by the inclined surface CLS, and accordingly, a minimum thickness T1 and a maximum thickness T2 may be defined in the overlapping region OA.

That is, the thickness of the overlapping region is formed differently for each position. As a result, a region in which the adhesive layer 420 is disposed to have a large thickness and a region in which the adhesive layer 420 is disposed to have a small thickness may be formed inside the receiving part 320.

For example, referring to FIG. 4, the adhesive layer 420 may be formed in a shape in which the thickness thereof gradually decreases while extending in one direction.

Alternatively, referring to FIG. 5, the adhesive layer 420 may be formed in a shape in which a thickness is repeatedly increased and decreased while extending in one direction.

The light path control member according to the embodiment forms a non-uniform thickness of the adhesive layer. As a result, the driving characteristics of the light path control member can be improved.

Figure 6A:
FIGS. 6 (a) and 6 (b) are views for explaining a resistance difference of a light path control member according to a change in a thickness of the adhesive layer.
Figure 6B:
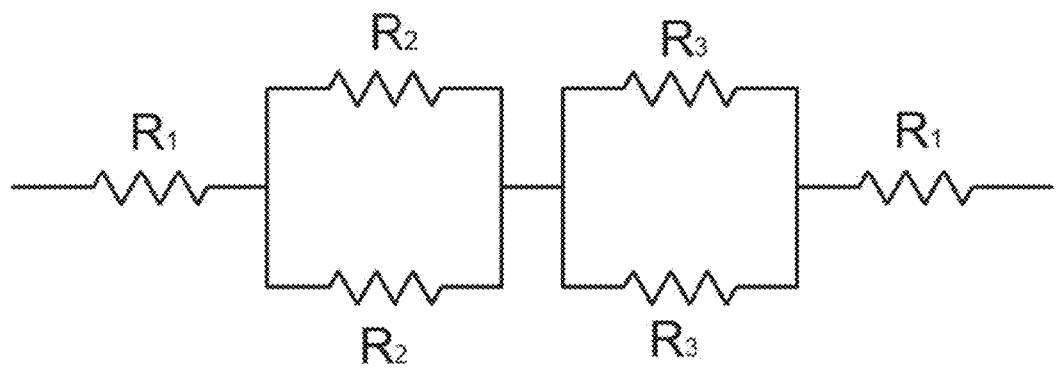

FIGS. 6 (*a*) and 6 (*b*) are views for explaining a resistance difference between the electrode, the adhesive layer, and the light conversion material according to a change in the thickness of the adhesive layer.

FIG. 6(*a*) is a diagram illustrating a resistance flow when the contact surface CS is a flat surface. That is, FIG. 6(*a*) is a diagram illustrating a resistance flow when the thickness of the adhesive layer is uniform in the overlapping region. Also, FIG. 6(*b*) is a diagram illustrating a resistance flow when the contact surface CS has an inclined surface. That is, FIG. 6(*b*) is a diagram illustrating a resistance flow when the thickness of the adhesive layer is uneven in the overlapping region.

Referring to FIG. 6(*a*), the light conversion material is affected by resistance according to the thickness of the adhesive layer. That is, since the thickness of the adhesive layer disposed inside the receiving part is uniform, the light conversion material is affected in proportion to the thickness of the adhesive layer. Accordingly, the driving characteristics of the light path control member may be reduced.

On the other hand, referring to FIG. 6(*b*), the light conversion material may apply different resistances for each region in contact with the adhesive layer. That is, since the thickness of the adhesive layer disposed inside the receiving part is non-uniform, a small resistance is applied to the light conversion material in a region in which the thickness of the adhesive layer is small. Also, a large resistance is applied in a region in which the thickness of the adhesive layer is large.

That is, in FIG. 6(*b*), the resistance according to the adhesive layer is formed in a parallel relationship. Therefore, even when the maximum thickness of the adhesive layer is increased, the decrease in driving characteristics due to the resistance of the adhesive layer may be offset by the adhesive layer having a small thickness.

Accordingly, the light path control member according to an embodiment may minimize the resistance due to the adhesive layer by unevenly forming the thickness of the adhesive layer of the overlapping region. Accordingly, the light path control member may have improved driving characteristics.

The minimum thickness T1 and the maximum thickness T2 of the adhesive layer 420 may be formed at a predetermined ratio.

In detail, the ratio of the minimum thickness T1 to the maximum thickness T2 of the adhesive layer 420 may be 1:1.5 or more, 1:3 or more, or 1:4 or more.

When the ratio of the minimum thickness T1 to the maximum thickness T2 of the adhesive layer 420 is less than 1:1.5, the effect of reducing the resistance of the adhesive layer 420 due to the difference in the thickness of the adhesive layer is reduced. Accordingly, the driving characteristics of the light path control member may be reduced.

Also, a thickness deviation of the adhesive layer 420 disposed inside the plurality of receiving parts 320 may be controlled. Specifically, the deviation of the maximum thickness of the adhesive layer 420 disposed inside the plurality of receiving parts 320 may be about 10% or less. That is, the difference between the thickness of the adhesive layer in the receiving part having the largest thickness of the adhesive layer 420 and the thickness of the adhesive layer in the receiving part having the smallest maximum thickness of the adhesive layer 420 among the plurality of receiving parts 320 may be 10% or less, 5% or less, or 3% or less.

When the deviation of the maximum thickness of the adhesive layer 420 disposed inside the plurality of receiving parts 320 is more than 10%, the deviation of the resistance according to the adhesive layer in each receiving part increases. Accordingly, the deviation of the light conversion characteristics of the light conversion material disposed in each receiving part may increase.

As a result, a deviation in the light conversion time occurs in each receiving part. Thereby, the user's visibility can be reduced.

Figure 8:
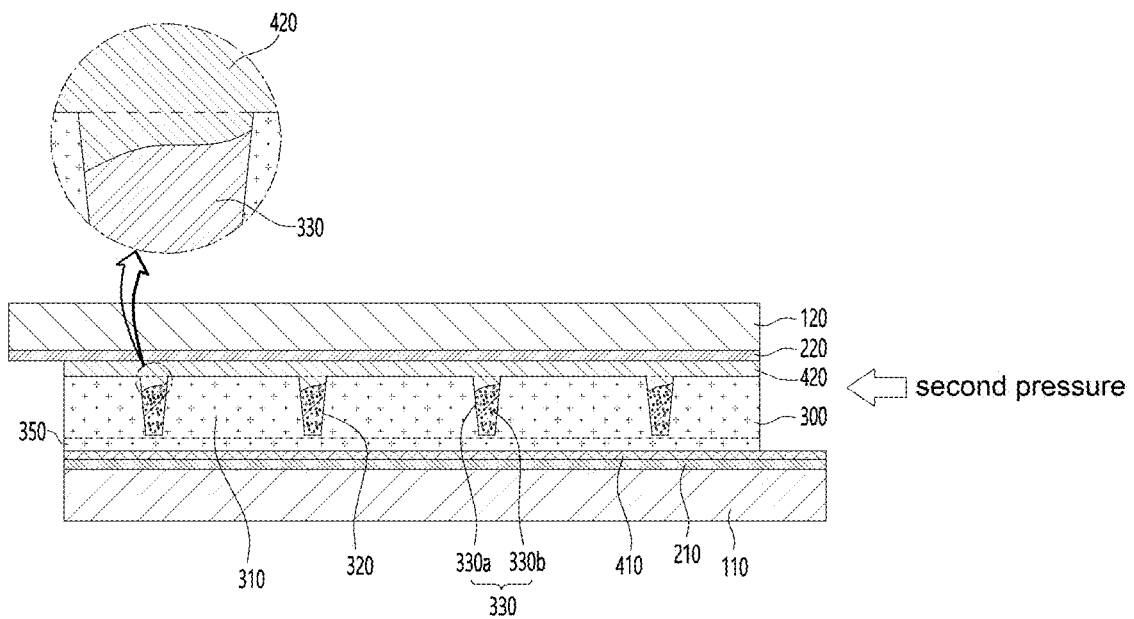
Figure 9:
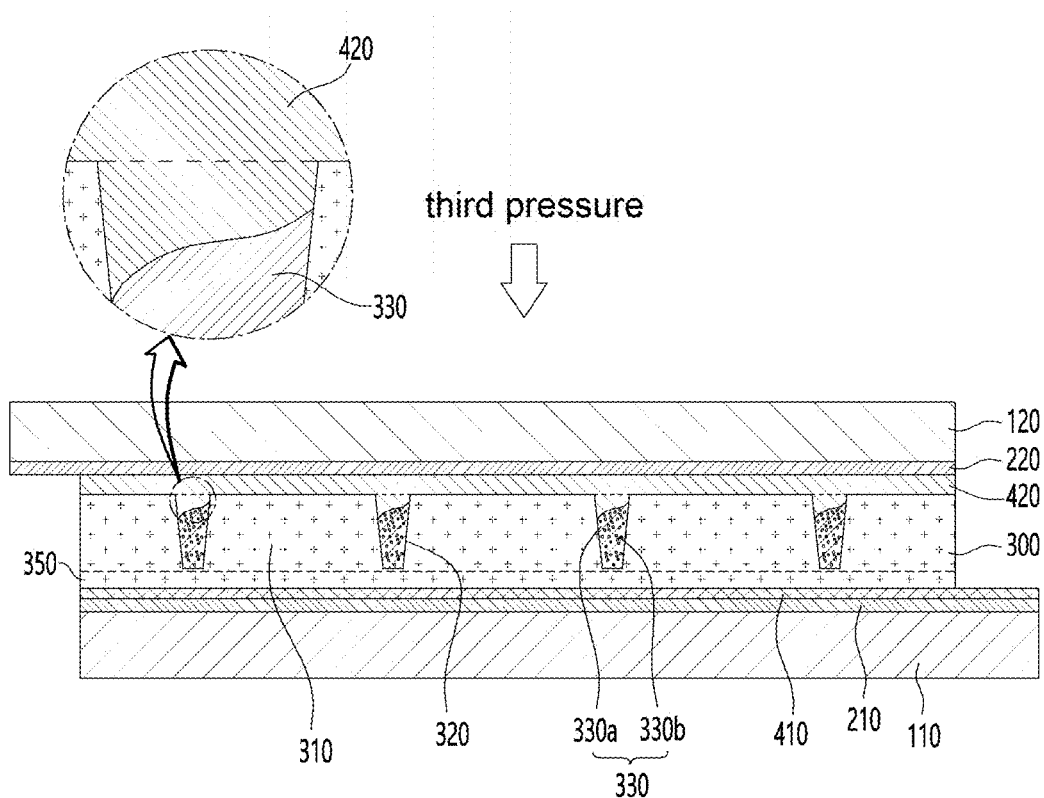

Hereinafter, a process of manufacturing the above-described light path control member will be described with reference to FIGS. 7 to 9.

Referring to FIG. 7, the first electrode 210 and the buffer layer 410 are disposed on the first substrate 110. Also, the light conversion part 300 is disposed on the buffer layer 410.

Subsequently, the second electrode 220 is formed on the second substrate 120. Also, the adhesive layer 420 is formed by applying an adhesive material on the second electrode 220.

Subsequently, the second substrate 120 and the first substrate 110 are laminated. Subsequently, a first pressure is applied in the third direction 3D. That is, the first pressure may be applied in a thickness direction of the partition wall part 310.

In this case, the first pressure is applied to a pressure less than a pressure for bonding the second electrode 210 and the light conversion part 300.

The second electrode 220 and the light conversion part 300 are temporarily bonded by the adhesive layer 410 and the first pressure. Also, the adhesive layer 410 is introduced into the receiving part 320. Accordingly, the adhesive layer 410 is also disposed in the receiving part 320 in a region overlapping the receiving part 320.

Subsequently, referring to FIG. 8, a second pressure is applied. The second pressure is applied in a direction different from the direction in which the first pressure is applied. Specifically, the second pressure is applied in the first direction 1D. That is, the second pressure may be applied in a direction perpendicular to the extending direction of the partition wall part 310.

The shape of the adhesive layer 420 disposed inside the receiving part 320 is changed by the adhesive layer 410 and the second pressure. Specifically, the adhesive layer 420 disposed inside the receiving part 320 moves in the first direction 1D by the second pressure. As a result, the thickness of the adhesive layer 420 disposed inside the receiving part 320 becomes non-uniform. That is, the adhesive layer 420 disposed inside the receiving part 320 moves in the direction in which the second pressure is applied. As a result, the thickness of the adhesive layer in the direction in which the second pressure is applied is increased. Also, the thickness in the direction opposite to the direction in which the second pressure is applied is reduced.

Subsequently, referring to FIG. 9, a third pressure is applied. The third pressure is applied in the same direction as the first pressure. Specifically, the third pressure may be applied in the third direction 3D.

The second electrode 220 and the light conversion part 300 are adhered by the adhesive layer 410 and the third pressure.

The third pressure is greater than the first pressure. That is, the adhesive layer 420 adheres the second electrode 220 and the light conversion part 300 through the third pressure. Therefore, the third pressure is applied with the magnitude of the pressure for adhesion.

The light path control member according to the embodiment has improved driving speed.

In detail, the adhesive layer disposed inside the receiving part is formed to have a non-uniform thickness. As a result, the resistance caused by the adhesive layer can be reduced.

Accordingly, it is possible to inhibit the light conversion characteristics of the light conversion material disposed inside the receiving part from being reduced due to the resistance of the adhesive layer.

In addition, the light path control member according to the embodiment may have improved driving characteristics.

In detail, a thickness difference of the adhesive layer disposed inside a plurality of receiving parts can be formed within a set range. As a result, a difference in light conversion speed between the plurality of receiving parts can be reduced. Accordingly, the driving characteristics of the light path control member can be improved.

Hereinafter, a display device and a display device to which a light path control member according to an embodiment is applied will be described with reference to FIGS. 10 to 14.

Figure 10:
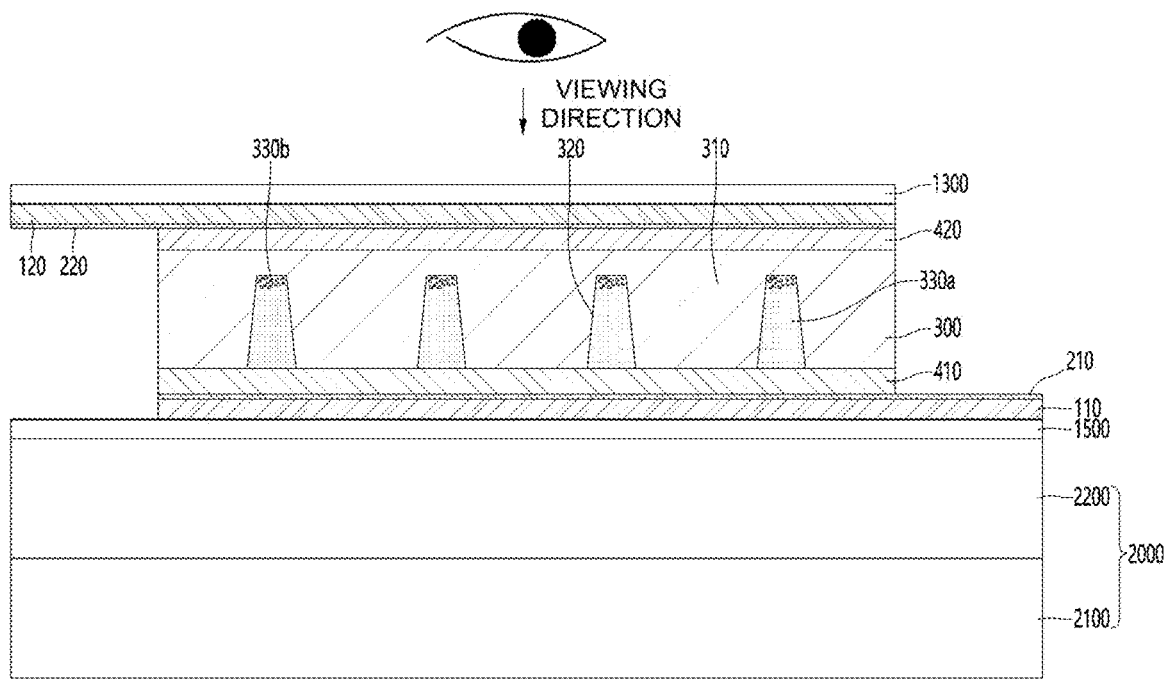
FIGS. 10 and 11 are cross-sectional views of a display device to which an light path control member according to an embodiment is applied.
Figure 11:
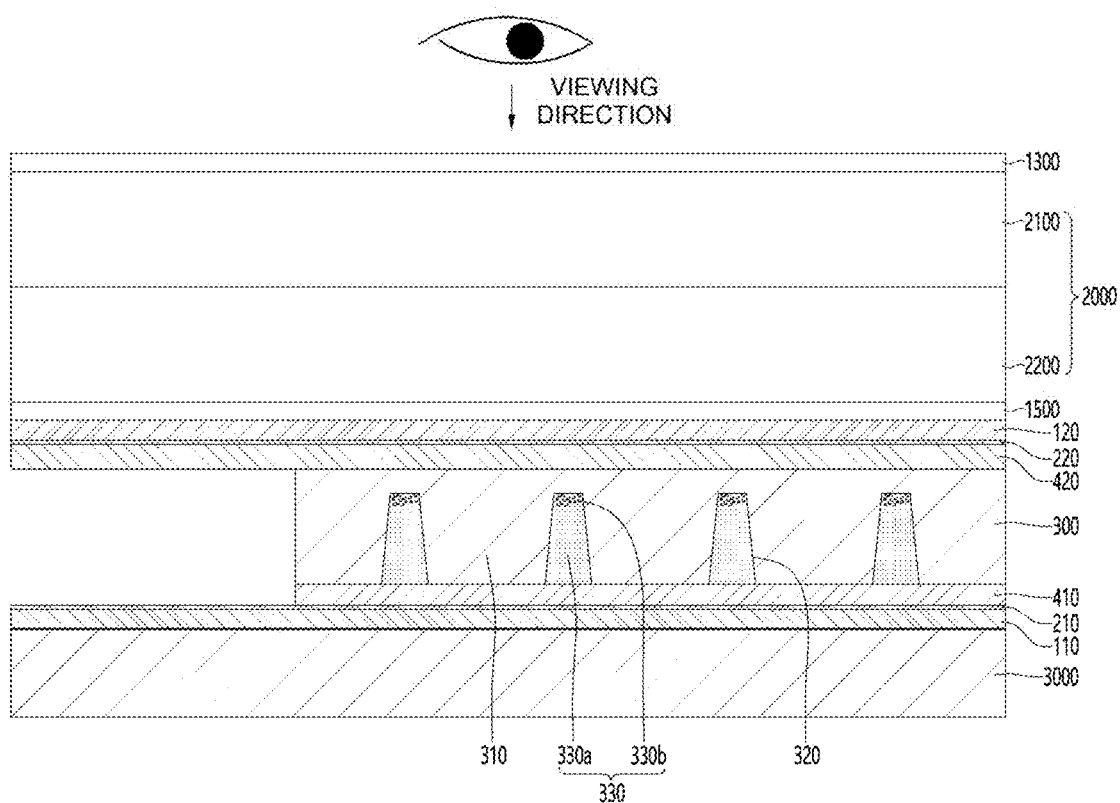

Referring to FIGS. 10 and 11, the light path control member 1000 according to the embodiment may be disposed on or below the display panel 2000.

The display panel 2000 and the light path control member 1000 may be disposed to be adhered to each other. For example, the display panel 2000 and the light path control member 1000 may be adhered to each other via an adhesive member 1500. The adhesive member 1500 may be transparent. For example, the adhesive member 1500 may include an adhesive or an adhesive layer including a light transparent adhesive material.

The adhesive member 1500 may include a release film. In detail, when adhering the light path control member and the display panel, the light path control member and the display panel may be adhered after the release film is removed.

The display panel 2000 may include a first base substrate 2100 and a second base substrate 2200. When the display panel 2000 is a liquid crystal display panel, the light path control member may be formed under the liquid crystal panel. That is, when a surface viewed by the user in the liquid crystal panel is defined as an upper portion of the liquid crystal panel, the light path control member may be disposed under the liquid crystal panel. The display panel 2000 may be formed in a structure in which the first base substrate 2100 including a thin film transistor (TFT) and a pixel electrode and the second base substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first base substrate 2100 and the second base substrate 2200 is bonded to the first base substrate 2100 with the liquid crystal layer interposed therebetween. That is, a thin film transistor may be formed on the first base substrate 2100, a protective film may be formed on the thin film transistor, and a color filter layer may be formed on the protective film. In addition, a pixel electrode in contact with the thin film transistor may be formed on the first base substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 11, the light path control member may be disposed under the liquid crystal panel and on the backlight unit 3000, and the light path control member may be disposed between the backlight unit 3000 and the display panel 2000.

Alternatively, as shown in FIG. 10, when the display panel 2000 is an organic light emitting diode panel, the light path control member may be formed on the organic light emitting diode panel. That is, when the surface viewed by the user in the organic light emitting diode panel is defined as an upper portion of the organic light emitting diode panel, the light path control member may be disposed on the organic light emitting diode panel. The display panel 2000 may include a self-luminous element that does not require a separate light source. In the display panel 2000, a thin film transistor may be formed on the first base substrate 2100, and an organic light emitting element in contact with the thin film transistor may be formed. The organic light emitting element may include an anode, a cathode, and an organic light emitting layer formed between the anode and the cathode. In addition, the second base substrate 2200 configured to function as an encapsulation substrate for encapsulation may be further included on the organic light emitting element.

That is, light emitted from the display panel 2000 or the backlight unit 3000 may move from the second substrate 120 of the light path control member toward the first substrate 110.

In addition, although not shown in drawings, a polarizing plate may be further disposed between the light path control member 1000 and the display panel 2000. The polarizing plate may be a linear polarizing plate or an external light reflection preventive polarizing plate. For example, when the display panel 2000 is a liquid crystal display panel, the polarizing plate may be a linear polarizing plate. Further, when the display panel 2000 is the organic light emitting diode panel, the polarizing plate may be an external light reflection inhibiting polarizing plate.

In addition, an additional functional layer 1300 such as an anti-reflection layer, an anti-glare, or the like may be further disposed on the light path control member 1000. Specifically, the functional layer 1300 may be adhered to one surface of the first substrate 110 of the light path control member. Although not shown in drawings, the functional layer 1300 may be adhered to the first substrate 110 of the light path control member via an adhesive layer. In addition, a release film for protecting the functional layer may be further disposed on the functional layer 1300.

Further, a touch panel may be further disposed between the display panel and the light path control member.

It is shown in the drawings that the light path control member is disposed at an upper portion of the display panel, but the embodiment is not limited thereto, and the light path control member may be disposed at various positions such as a position in which light is adjustable, that is, a lower portion of the display panel, or between a second substrate and a first substrate of the display panel, or the like.

In addition, it is shown in the drawings that the light conversion part of the light path control member according to the embodiment is in a direction parallel or perpendicular to an outer surface of the second substrate, but the light conversion part is formed to be inclined at a predetermined angle from the outer surface of the second substrate. Through this, a moiré phenomenon occurring between the display panel and the light path control member may be reduced.

Figure 14:
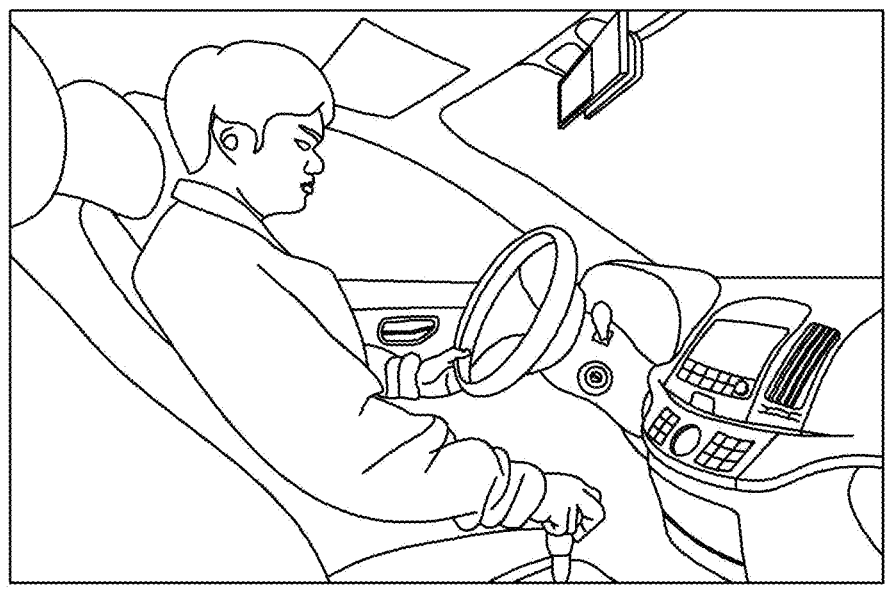

Referring to FIGS. 12 to 14, the light path control member according to the embodiment may be applied to a display device that displays a display.

Referring to FIGS. 12 to 14, the light path control member according to an embodiment may be applied to a display device that displays a display.

For example, when power is applied to the light path control member as shown in FIG. 12, the receiving part functions as the light transmitting part, so that the display device may be driven in the public mode, and when power is not applied to the light path control member as shown in FIG. 13, the receiving part functions as the light blocking part, so that the display device may be driven in the light blocking mode.

Accordingly, a user may easily drive the display device in a privacy mode or a normal mode according to application of power.

Light emitted from the backlight part or the self-luminous element may move from the first substrate toward the second substrate. Alternatively, the light emitted from the backlight part or the self-luminous element may also move from the second substrate toward the first substrate.

In addition, referring to FIG. 14, the display device to which the light path control member according to the embodiment is applied may also be applied inside a vehicle.

For example, the display device including the light path control member according to the embodiment may display a video confirming information of the vehicle and a movement route of the vehicle. The display device may be disposed between a driver seat and a passenger seat of the vehicle.

In addition, the light path control member according to the embodiment may be applied to a dashboard that displays a speed, an engine, an alarm signal, and the like of the vehicle.

Further, the light path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

What is claimed is:

1. A light path control member comprising:
   a first substrate;
   a first electrode disposed on the first substrate;
   a light conversion part disposed on the first electrode;
   an adhesive layer disposed on the light conversion part;
   a second electrode disposed on the adhesive layer; and
   a second substrate disposed on the second electrode;
   wherein the light conversion part includes:
   a plurality of receiving parts that extend lengthwise in a first direction and are spaced apart from each other in a second direction different from the first direction, and
   a partition wall part disposed between the plurality of receiving parts, wherein the adhesive layer includes an overlapping region in contact with the receiving part, and a non-overlapping region in contact with the partition wall part, and wherein a thickness difference of the overlapping region along the second direction is greater than a thickness difference of the non-overlapping region along the second direction.

2. The light path control member of claim 1, wherein the overlapping region includes a minimum thickness and a maximum thickness, and wherein a ratio of the minimum thickness of the overlapping region to the maximum thickness of the overlapping region is 1:1.5 or more.

3. The light path control member of claim 1, wherein a thickness of the adhesive layer is in a range of 2% to 25% of a thickness of the receiving part in the overlapping region.

4. The light path control member of claim 1, wherein a light conversion material is disposed inside the receiving part, and wherein a thickness of the overlapping region is defined as a thickness from a contact surface between the adhesive layer and the second electrode to a contact surface between the adhesive layer and the light conversion material.

5. The light path control member of claim 1, wherein a thickness of the overlapping region of the adhesive layer decreases along the second direction.

6. The light path control member of claim 5, wherein the overlapping region includes a first side end and a second side end facing along the second direction, wherein a maximum thickness of the overlapping region is a thickness at the first side end, and wherein a minimum thickness of the overlapping region is a thickness at the second side end.

7. The light path control member of claim 5, wherein the overlapping region includes a first side end and a second side end facing along the second direction, and wherein the overlapping region has a maximum thickness in a region adjacent to the first side end and a minimum thickness in a region adjacent to the second side end.

8. The light path control member of claim 1, wherein a thickness of the overlapping region of the adhesive layer repeatedly decreases and increases along the second direction.

9. The light path control member of claim 8, wherein a lower surface of the overlapping region includes a plurality of concave portions concave toward the second electrode, and a convex portion positioned between the plurality of concave portions and convex toward the receiving part.

10. The light path control member of claim 1, wherein a deviation of the thickness of the overlapping region of the adhesive layer is 10% or less.

11. The light path control member of claim 1, wherein a lower surface of the overlapping region has a curve, and a lower surface of the non-overlapping region is flat.

12. The light path control member of claim 1, wherein a thickness of the overlapping region changes along the second direction, and wherein a thickness of the non-overlapping region does not change along the second direction.

13. A display apparatus comprising:
a panel including at least one of a display panel and a touch panel; and
an light path control member of disposed on or below the panel, wherein the light path control member includes:
a first substrate;
a first electrode disposed on the first substrate;
a light conversion part disposed on the first electrode;
an adhesive layer disposed on the light conversion part;
a second electrode disposed on the adhesive layer; and
a second substrate disposed on the second electrode;
wherein the light conversion part includes:
a plurality of receiving parts that extend lengthwise in a first direction and are spaced apart from each other in a second direction different from the first direction, and
a partition wall part disposed between the plurality of receiving parts, wherein the adhesive layer includes an overlapping region in contact with the receiving part, and a non-overlapping region in contact with the partition wall part, and wherein a thickness difference of the overlapping region along the second direction is greater than a thickness difference of the non-overlapping region along the second direction.

14. The display apparatus of claim 13, wherein the panel includes a backlight unit and a liquid crystal display panel, wherein the light path control member is disposed between the backlight unit and the liquid crystal display panel, and wherein light emitted from the backlight unit moves in a direction from the second substrate to the first substrate.

15. The display apparatus of claim 13, wherein the panel includes an organic light emitting diode panel, wherein the light path control member is disposed on the organic light emitting diode panel, and wherein light emitted from the panel moves in a direction from the second substrate to the first substrate.

16. The display apparatus of claim 13, wherein a lower surface of the overlapping region has a curve, and a lower surface of the non-overlapping region is flat.

17. The display apparatus of claim 13, wherein the overlapping region includes a first side end and a second side end facing along the second direction, wherein a maximum thickness of the overlapping region is a thickness at the first side end, and wherein a minimum thickness of the overlapping region is a thickness at the second side end.

18. The display apparatus of claim 13, wherein the overlapping region includes a first side end and a second side end facing along the second direction, and wherein the overlapping region has a maximum thickness in a region adjacent to the first side end and a minimum thickness in a region adjacent to the second side end.

19. The display apparatus of claim 13, wherein a lower surface of the overlapping region includes a plurality of concave portions concave toward the second electrode, and a convex portion positioned between the plurality of concave portions and convex toward the receiving part.

20. The display apparatus of claim 13, wherein a thickness of the overlapping region changes along the second direction, and wherein a thickness of the non-overlapping region does not change along the second direction.

* * * * *